United States Patent [19]

Sayag

[11] Patent Number: 5,737,098
[45] Date of Patent: Apr. 7, 1998

[54] ELECTRONIC COLOR SNAPSHOT TECHNIQUE AND STRUCTURE USING VERY HIGH RESOLUTION MONOCHROME FULL FRAME CCD IMAGERS

[75] Inventor: Michel Sayag, Mt. View, Calif.

[73] Assignee: Loral Fairchild Corporation, Syosset, N.Y.

[21] Appl. No.: 559,510

[22] Filed: Nov. 15, 1995

Related U.S. Application Data

[63] Continuation of Ser. No. 994,875, Dec. 23, 1992, abandoned.

[51] Int. Cl.$^6$ ............................. H04L 1/04; H04N 3/14; H04N 5/335
[52] U.S. Cl. ........................ 358/483; 358/482; 348/294; 348/311; 348/316; 348/317
[58] Field of Search ........................... 358/482, 483; 348/294, 311, 316, 317

[56] References Cited

U.S. PATENT DOCUMENTS

| Re. 32,492 | 9/1987 | Takemura | 358/44 |
|---|---|---|---|
| Re. 32,521 | 10/1987 | Fergason | |
| 4,385,806 | 5/1983 | Fergason | 349/34 |
| 4,420,218 | 12/1983 | Rubanov et al. | 359/24 |
| 4,437,112 | 3/1984 | Tanaka et al. | 348/279 |
| 4,540,243 | 9/1985 | Fergason | 359/156 |
| 4,566,758 | 1/1986 | Bos | 349/128 |
| 4,567,510 | 1/1986 | Tanaka et al. | 348/273 |
| 4,582,396 | 4/1986 | Bos et al. | 349/180 |
| 4,663,661 | 5/1987 | Weldy et al. | 348/242 |
| 4,719,507 | 1/1988 | Bos | 348/57 |
| 4,760,441 | 7/1988 | Kohno | 348/278 |
| 4,875,098 | 10/1989 | Yamamoto et al. | 348/250 |
| 4,903,284 | 2/1990 | Esser | 377/62 |
| 4,935,820 | 6/1990 | Patel et al. | 358/302 |
| 4,989,075 | 1/1991 | Ito | 348/280 |
| 5,101,266 | 3/1992 | Schlig et al. | 358/505 |

(List continued on next page.)

FOREIGN PATENT DOCUMENTS

| 1200591 | 2/1986 | Canada . |
|---|---|---|
| 1224558 | 7/1987 | Canada . |
| 0523781 | 1/1993 | European Pat. Off. . |
| 4-1888 | 1/1992 | Japan . |
| 2063617 | 6/1981 | United Kingdom . |
| 2161671 | 1/1986 | United Kingdom . |

OTHER PUBLICATIONS

Greivenkamp, J.E., "Color Dependent Optical Prefilter for the Suppression of Aliasing Artifacts," *Applied Optics* (10 Feb. 1990), 29(5):676–684.

Ozawa, N., et al., "A Correlative Coefficient Multiplying (CCM) Method for Chrominance Moire Reduction in Single–Chip Color Video Cameras," *IEEE Transactions on Electron Devices* (May 1991) 38(5):1217–1225.

(List continued on next page.)

*Primary Examiner*—Kim Vu
*Assistant Examiner*—Tia M. Harris
*Attorney, Agent, or Firm*—Townsend and Townsend and Crew LLP

[57] ABSTRACT

A technique and structure is used for producing high resolution color images using a monochrome area charge-coupled device (CCD) 64 and a sequential color illumination scheme. The monochrome CCD 64 comprises a plurality of semiconductor storage cells 76, the semiconductor storage cells 76 being configured in an array having vertical columns 74 and horizontal rows 79. The entire CCD 64 is exposed to a first color image. The charge packets 82 stored in two adjacent horizontal rows as a result of the exposure are then shifted into a third horizontal row. The CCD 64 is then exposed to a second color image. The charge packets 82 stored in the first horizontal row as a result of the second exposure are then shifted into the second horizontal row. The CCD 64 is then exposed to a third and final color image. The CCD output is digitized and stored in a frame. The color information of a particular location on the CCD array 64 is derived by utilizing a simple set of equations.

2 Claims, 10 Drawing Sheets

U.S. PATENT DOCUMENTS

| | | | |
|---|---|---|---|
| 5,122,831 | 6/1992 | Suzuki | 355/37 |
| 5,208,872 | 5/1993 | Fisher | 382/300 |
| 5,239,380 | 8/1993 | Yokoyama | 348/319 |
| 5,258,834 | 11/1993 | Tsuji et al. | 348/71 |
| 5,264,925 | 11/1993 | Shipp et al. | 348/269 |
| 5,272,535 | 12/1993 | Elabd | 348/314 |

OTHER PUBLICATIONS

Hoyt, C.C., et al., "Merging Spectroscopy and Digital Imaging Enhances Cell Research," *Photonics Spetra* (Nov. 1992), reprint.

Miller, P.J., "Use of Tunable Liquid Crystal Filters to Link Radiometric and Photometric Standards," *Metrologia* (1991) 28:145–149.

BTS, "Dynamic Pixel Management Sensors," undated advertising material.

Meadowlark Optics, "Liquid Crystal Filled Fabry–Perot Filter," *TechFlash*, undated technical bulletin, pp. 1–5.

Gilman, S.E., et al., "Properties of Tunable Nematic Liquid Crystal Retarders," undated technical publication.

Tektronix, Inc., "Nu 900M–9inch Color Display" (Feb. 1992) advertising material.

Tektronix, Inc., "NuCOLOR™ Shutters for Color Displays 1–19 Inch Diagonl," (Jun. 1992) advertising material.

Tektronix, Inc., "NuCOLOR™ Shutter," undated Technical Backgrounder.

Bos, P.J., et al., "Design Considerations for the π–cell, a Fast Electro–optical Switch," Tektronix, Inc., undated technical publication.

Amelio, Gilbert F., "Charge–Coupled Devices," *Scientific American*, Feb. 1974, pp. 296–303.

Melles Griot, "Polarization Components," *Optics Guide 5*, pp. 14–2 to 14–7.

Theuwissen, A.J.P., et al., "The Accordion Imager: An Ultra High Density Frame Transfer CCD," *Proceedings of the International Electron Devices Meeting* (1984), pp. 40–43.

ELECTRONIC COLOR SNAPSHOT TECHNIQUE AND STRUCTURE USING VERY HIGH RESOLUTION MONOCHROME FULL FRAME CCD IMAGERS

This is a continuation of Ser. No. 07/994,875 filed Dec. 23, 1992 abandoned.

BACKGROUND OF THE INVENTION

This invention relates to a technique and structure for producing very high resolution color images using a monochrome charge-coupled device (CCD) imager and a sequential color illumination scheme.

Conventional schemes for obtaining color electronic snapshots have traditionally employed one of three techniques. The first of these techniques uses white light illumination of a color CCD imager (FIG. 1). A color CCD imager 10 comprises a monochrome CCD imager upon which color sensitive stripes 14, 16, and 18 are deposited resulting in a mosaic of color pixels 12. The stripes are generally photo sensitive to alternating complementary colors such as red, green, and blue.

The second technique uses white light illumination of a color CCD imaging module. As illustrated by FIG. 2, a color CCD imaging module 20 employs three monochrome CCD imagers 22, 24, and 26 placed behind a beam-splitter 28. The beam-splitter separates the incoming radiation 30 into three beams of different spectral bands (typically, red 32, green 34, and blue 36), with each imaging module storing one of the monochrome images. Both of these techniques can be used to obtain snapshots of subject matter with brief exposure time (e.g., moving objects), however the cost is considerable.

A third technique, as shown in FIG. 3, employs a system 40 which uses a monochrome CCD imager with a sequential color illumination scheme. A filter wheel 42 is rotated in front of the imager 44 or the light source 46 so that the imager is exposed to a series of the color images which are then read out sequentially. This technique is less expensive than the previously described techniques, but has limitations in the subject matter for which it can be used. Because the monochrome imager is generally exposed to three color images sequentially, the exposure time for obtaining a complete image is often longer than that required for the other techniques.

This problem is aggravated by the fact that the preferred CCD imager architecture for very high resolution color snapshots is the full frame architecture. The full frame architecture provides the highest pixel density but at the cost of maintaining a storage area. As a result of the fact that there is no storage area, image integration and readout times have to be successive rather than simultaneous as with other architectures used, for example, in video applications. Because of the need to shield the imager during successive image read-outs the total exposure time must include three integration times (one for each color) and two read-out times.

FIG. 4 shows a timing diagram which is representative of a typical exposure time. The top time line 47 is the integration time line which indicates when the CCD imager is exposed to an image. The middle time line 48 is the read-out time line which indicates when a stored image is being read out. The bottom time line 49 is the total exposure time line which represents the time required to acquire a complete color image.

At $t_1$, the imager is exposed to the blue portion of the image (integration time line 47). The image stored during the exposure is then read out beginning at time $t_2$ (read-out time line 48). After the image is downloaded, the imager is exposed to the red portion of the image at $t_3$. The red portion of the image is then downloaded at time $t_4$. Finally, at $t_5$ the imager is exposed to the green portion of the image which is read out at $t_6$. Thus, as illustrated on the total exposure time line 49, this imaging scheme requires three exposures and two read-out intervals before a complete color image can be obtained. In addition, the high density of pixels and sequential nature of the downloading of imaging information further increases the total exposure time, often taking as long as five to ten seconds for a complete color image to be stored. The result being that this technique is unsuitable for creating images of moving subject matter.

FIG. 5 shows a simplified representation of a conventional three-phase full frame CCD imager 50 which can be used with any of the above-described techniques. Three gate electrodes 52 of each individual semiconductor storage cell 54 (one such cell shown outlined in bold lines) are controlled by one set of clock signals $\phi_1$, $\phi_2$, and $\phi_3$. Charge which is stored in each row of cells is shifted into a horizontal CCD register 56 from which it can be read out serially through output 58.

In light of the preceding discussion, it is apparent that there exists a need for a full frame, color CCD imager which combines the low cost of sequential color illumination with the speed of costly white light illumination schemes.

SUMMARY OF THE INVENTION

According to the invention, a technique and structure is provided for producing high resolution color images using a monochrome charge-coupled device (CCD) imager and a sequential color illumination scheme. The monochrome CCD imager comprises a plurality of semiconductor storage cells, the semiconductor storage cells being configured in an array having vertical columns and horizontal rows. Each vertical column comprises a CCD register that is isolated from adjacent columns by potential barriers. Each semiconductor storage cell, or pixel, has at least one gate electrode which controls the potential profile of the cell.

The invention uses a plurality of sets of clocks, each of which controls a portion of the horizontal rows of pixels. The gate electrodes of the pixels in a particular horizontal row are all connected to a single set of clocks. The horizontal rows controlled by one set of clocks are separated from others controlled by the same set of clocks by intervening rows which are controlled by other sets of clocks.

The procedure by which an image is stored will be described with reference to an embodiment of the invention in which three sets of clocks are employed, and each pixel has three gate electrodes. This is by no means the only configuration by which the invention may be implemented. To begin the procedure, the entire monochrome CCD imager is exposed to a first color image. The charge packets stored in the first and second sets of horizontal rows as a result of the exposure are then shifted into the third set of horizontal rows of pixels. The entire CCD imager is again exposed to a second color image. The charge packets stored in the first set of horizontal rows are then shifted into the second set of horizontal rows. The CCD imager is then exposed to a third and final color image.

To download the stored image, all of the vertical gate electrodes are clocked and shifted and all of the charge packets stored in each horizontal row are clocked into a horizontal register and then read out sequentially. The CCD imager output is digitized and stored in a frame. The color information of a particular location on the CCD array is derived by utilizing a simple set of equations described below.

Thus, the invention comprises an apparatus and method for producing color images using a monochrome charge-coupled device, the monochrome charge-coupled device comprising a plurality of semiconductor storage cells being controlled by gate electrodes, the semiconductor storage cells being configured in an array comprising vertical columns and horizontal rows. The method comprises the steps of: exposing the monochrome charge-coupled device to a first color portion of an image; moving charge packets stored in a first set of horizontal rows of semiconductor storage cells into a second set of horizontal rows of semiconductor storage cells; repeating said exposing and moving steps where the number of color portions of the image to which the charge-coupled device is exposed exceeds two, the steps to be repeated for each exposure in excess of two; exposing the monochrome charge-coupled device to a final color portion of the image; downloading final charge packets stored in each horizontal row of semiconductor storage cells into a horizontal charge-coupled device register, the horizontal charge-coupled device register storing the final charge packets from one horizontal row of semiconductor storage cells at a time; serially outputting from the horizontal charge-coupled device register the final charge packets from each horizontal row of semiconductor storage cells; storing digital information corresponding to the final charge packets; and processing the digital information to derive color information corresponding to locations on the monochrome charge-coupled device.

DESCRIPTION OF THE SPECIFIC EMBODIMENTS

Figure 1:
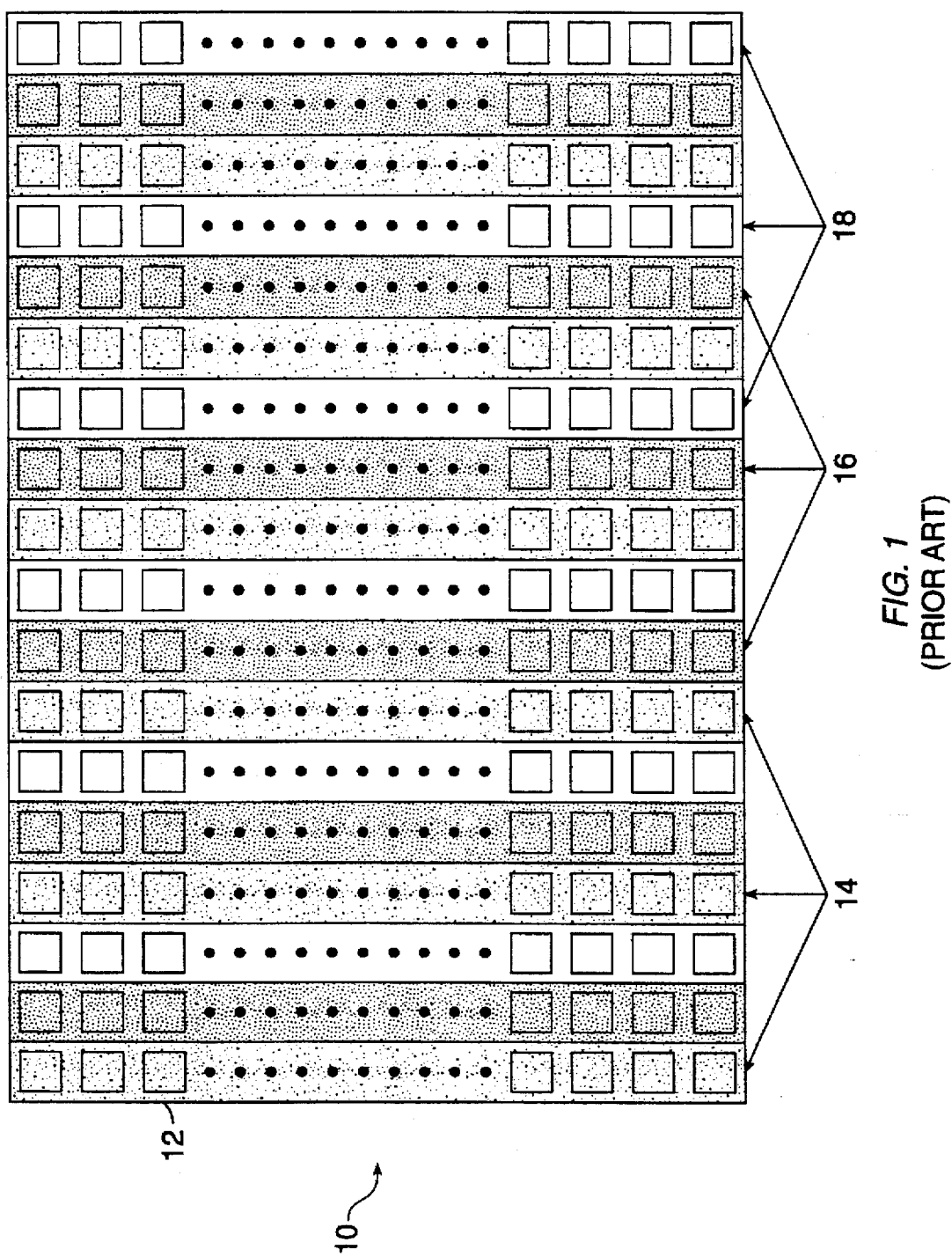
FIG. 1 is a simplified representation of a representative monolithic charge-coupled device color imager.
Figure 2:
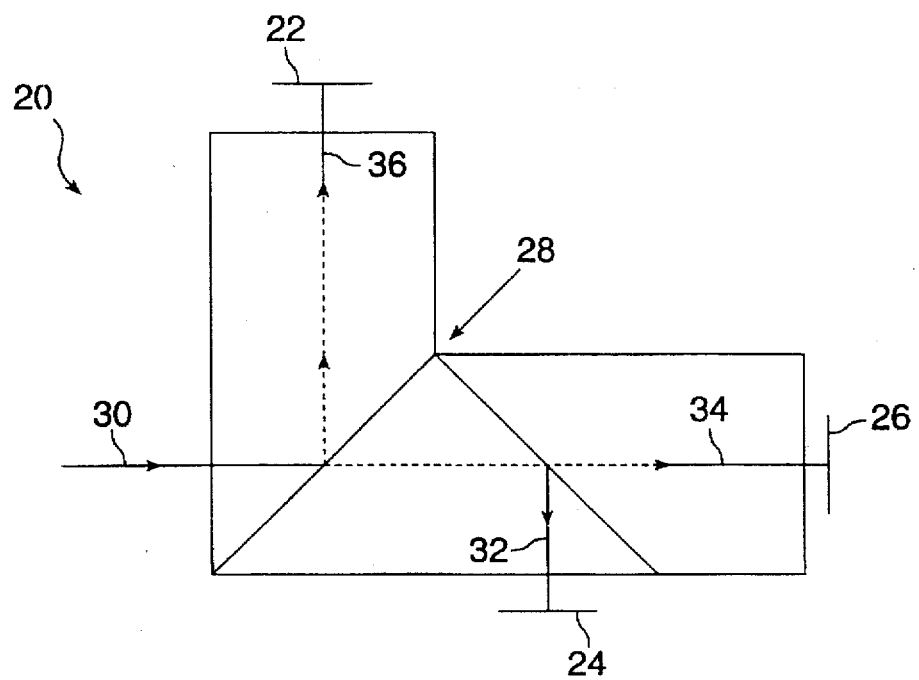
FIG. 2 is a simplified representation of a representative charge-coupled device color module.
Figure 3:
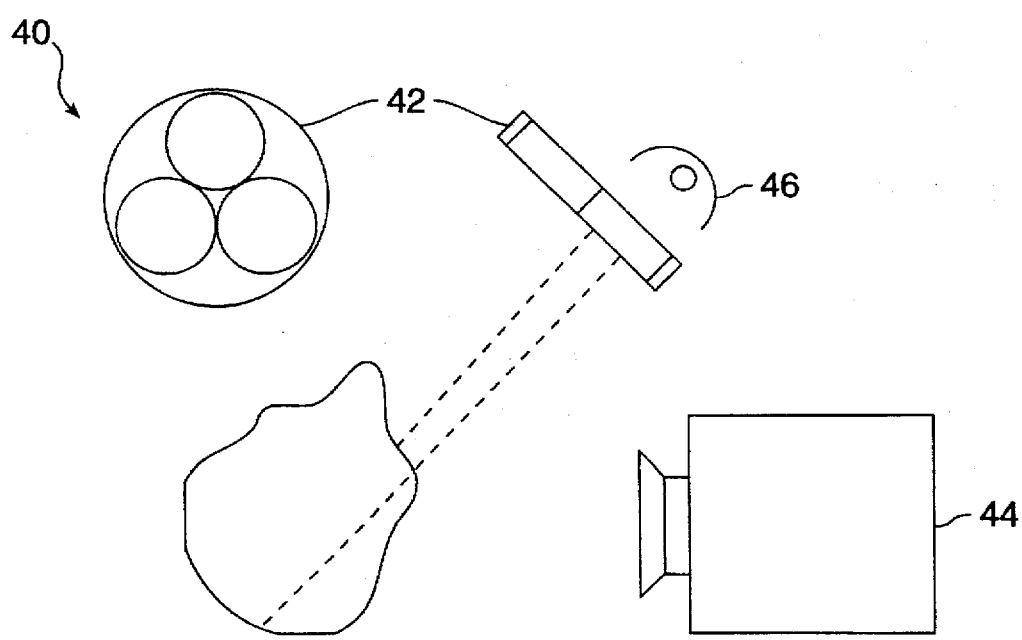
FIG. 3 is a simplified representation of a monochrome charge-coupled device imager camera system with a sequential color illumination scheme.
Figure 4:
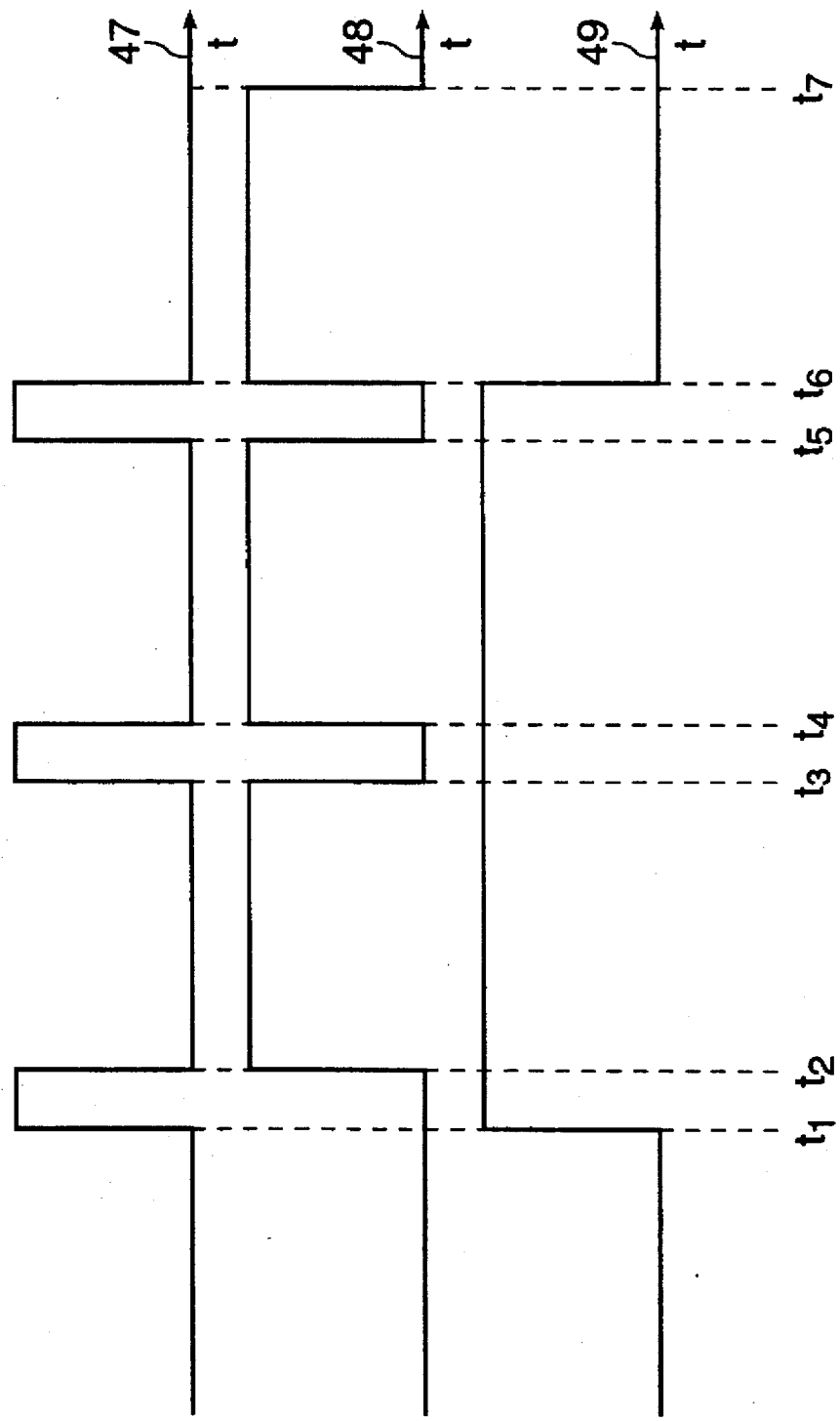
FIG. 4 is a timing diagram for a representative monochrome charge-coupled device imager camera system.
Figure 5:
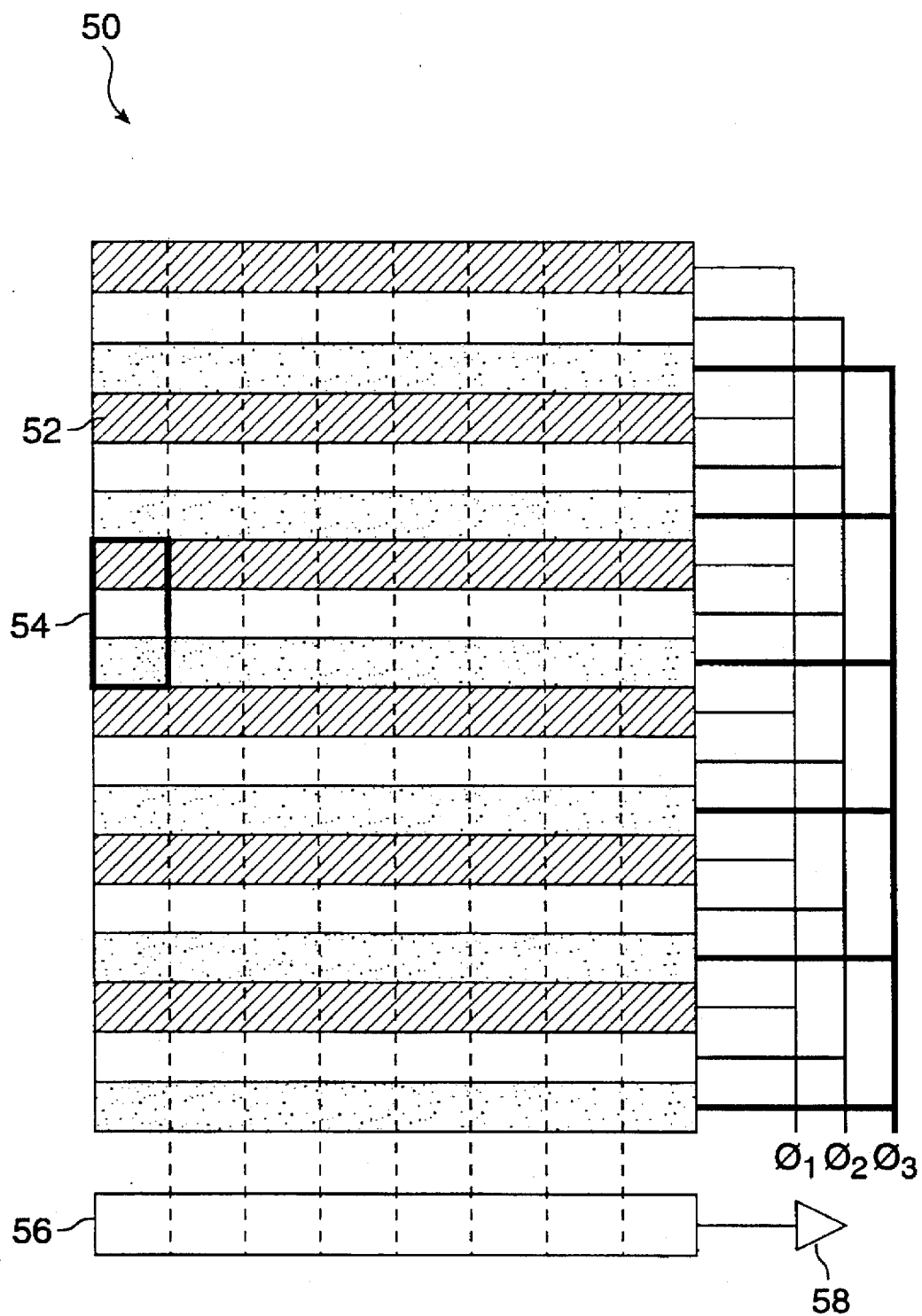
FIG. 5 is a simplified representation of a representative three-phase full frame charge-coupled device imager.
Figure 6A:
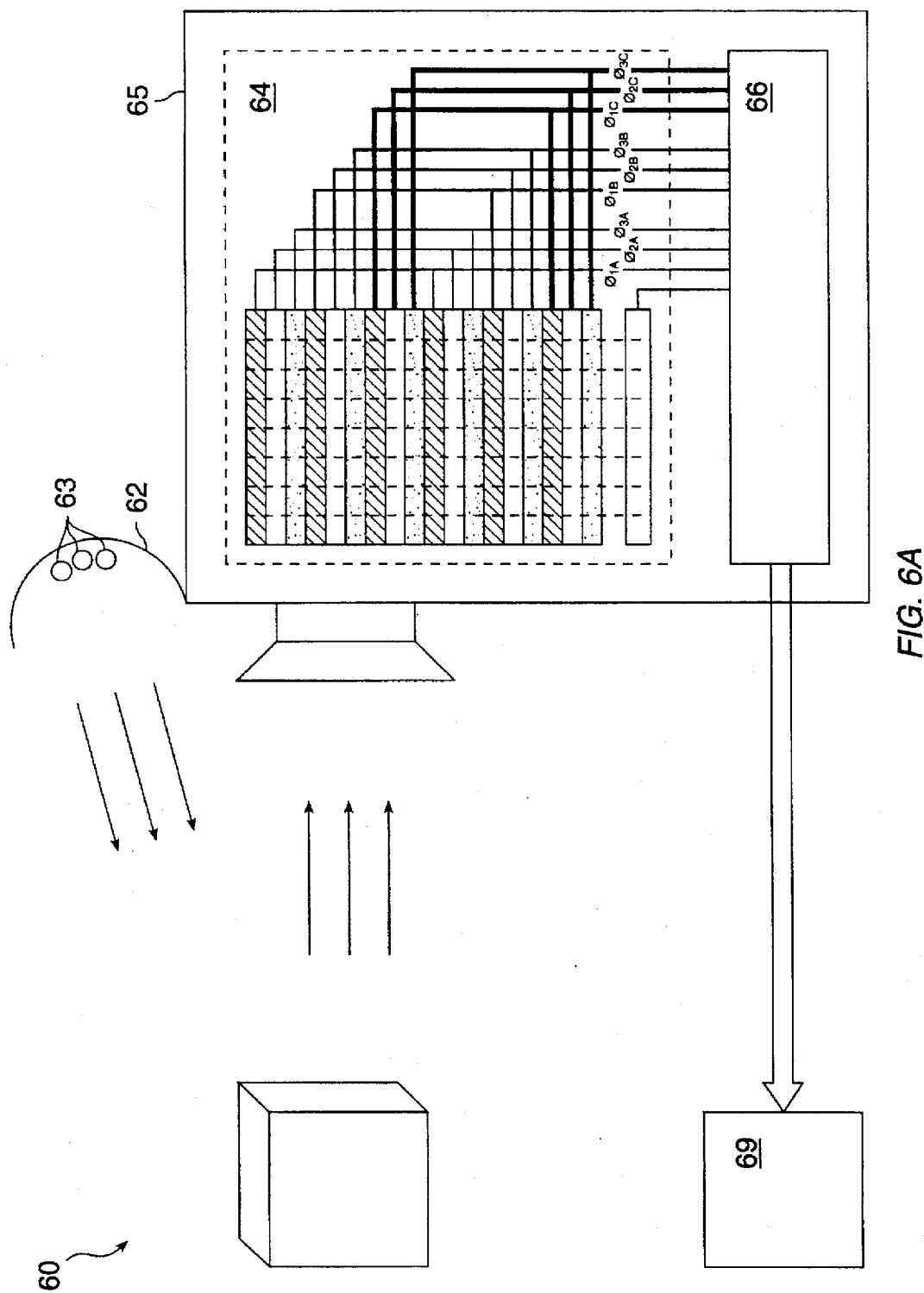
FIG. 6a is a block diagram of one embodiment of a photographic imaging system designed in accordance with the invention.
Figure 6B:
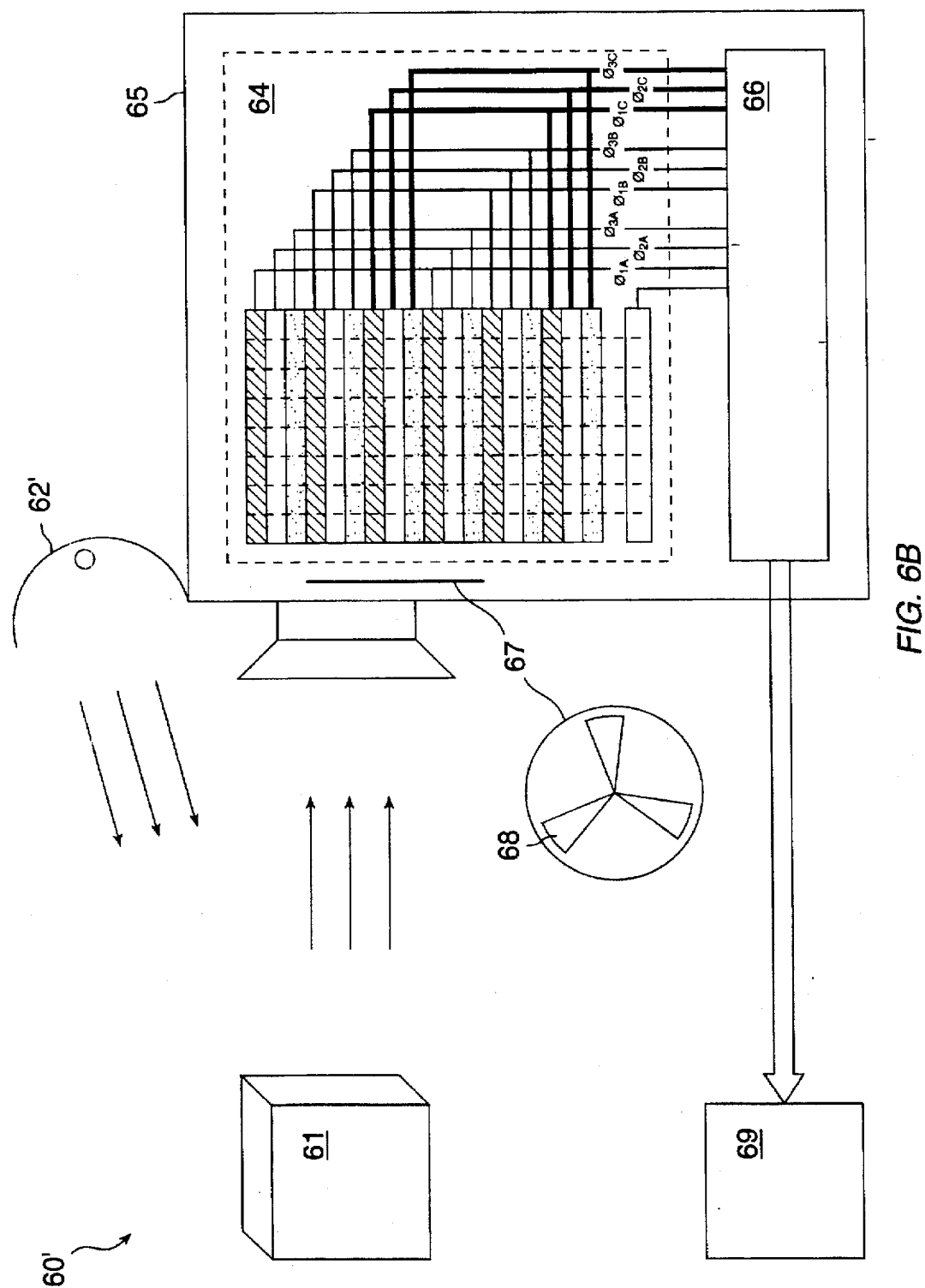
FIG. 6b is a block diagram of a second embodiment of a photographic imaging system designed in accordance with the invention.

FIGS. 6a and 6b are block diagrams of a two preferred embodiments of a photographic imaging system, 60 and 60'. In FIG. 6a, an illumination source 62 illuminates the subject matter 61, and thereby, the photosensitive surface of the CCD imager 64 contained in camera 65. This embodiment of the invention employs three strobe lights 63 to implement the illumination source 62. Each of the strobe lights 63 is equipped with a different color filter. To avoid image distortion such as color shadows, it is generally important to ensure that the three strobe lights 63 illuminate the scene from substantially the same angle. This may be accomplished by placing the strobe lights 63 as close together as possible, or by using a coaxial beam-splitter arrangement. The use of diffusers may also reduce the potential problem of color shadows.

Another embodiment of the invention, shown in FIG. 6b, employs a "color focal plane" shutter 67 in front of the monochrome CCD imager 64. The "color focal plane" shutter 67 is similar to conventional focal plane shutters. The shutter comprises three aperture slits 68 moving rapidly across the focal plane, thereby filtering the light from the white light illumination source 62'.

The imager 64 is controlled by a microcomputer 66 which manipulates the clock signals $\phi$, and which may perform any of the following functions: downloading the stored image; storing the image; processing the image; outputting the image to a display means 69 which may comprise, for example, a color printer or a video monitor; and controlling the strober 62 or shutter 67.

Figure 7:
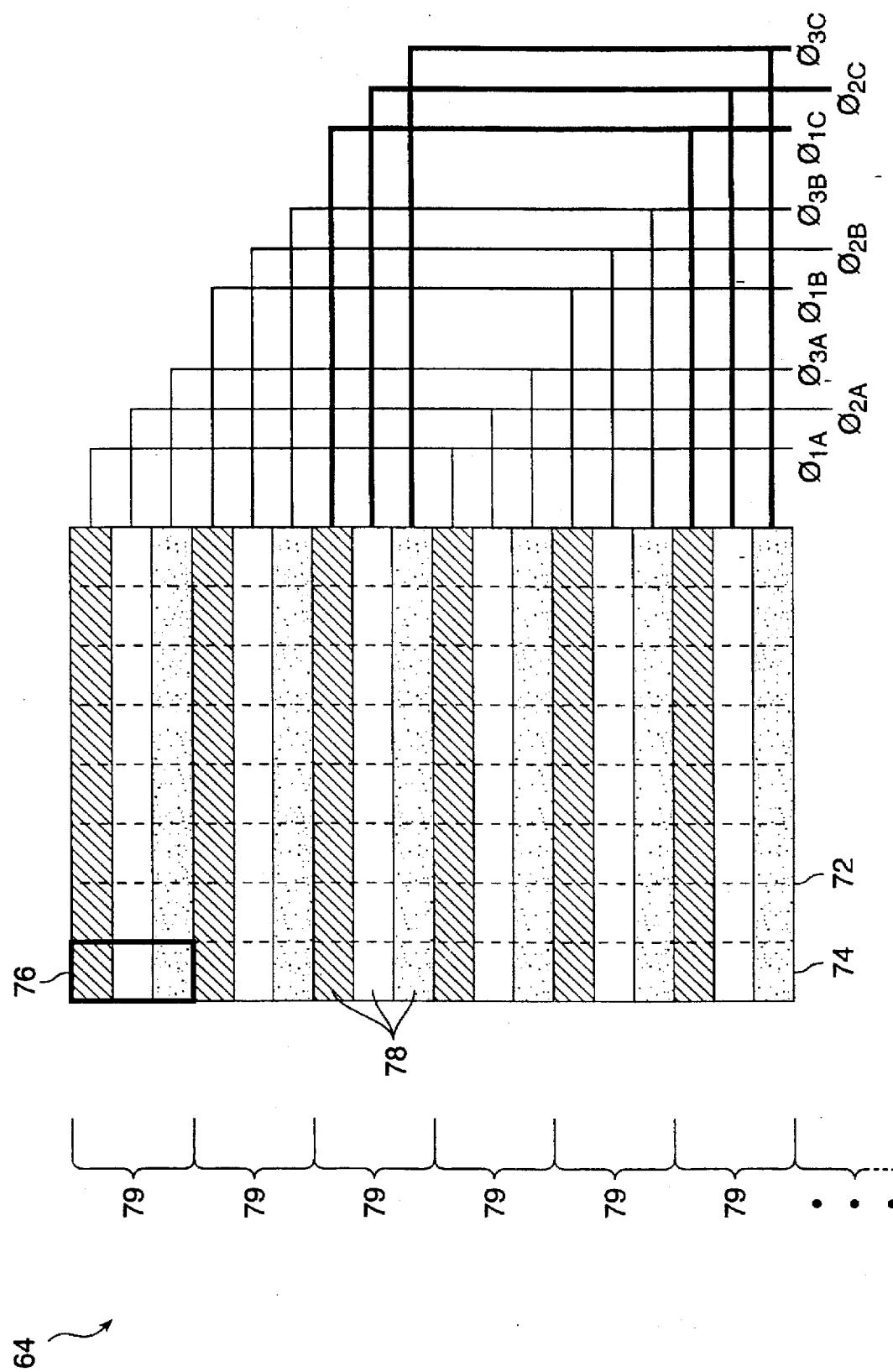
FIG. 7 is a simplified representation of a preferred embodiment of a full frame charge-coupled device imager designed in accordance with the invention.

FIG. 7 illustrates a portion of a monochrome CCD imager 64 constructed in accordance with the invention. Each column 74 (separated by potential barriers 72) represents a CCD register comprising a plurality of photosensitive semiconductor storage cells 76 (one such cell is outlined in bold lines). Each cell has three polysilicon gate electrodes 78 by which the cell's potential profile may be controlled using clock signals $\phi$. Each horizontal row 79 of cells 76 is controlled by one set of clocks out of three sets of clocks (e.g., Row 1 is controlled by a set of clocks $\phi_{nA}$, with n=1, 2, and 3), with each set of clocks controlling every third row as shown. Each set of clock signals is distinct from the other two sets of clock signals.

A preferred architecture for a very high resolution full frame CCD imager is defined as follows:

CCD imager active area size: 2¼"×2¼" (60 mm×60 mm) (i.e., compatible with the large negative format of very high resolution photography equipment, such as in cameras made by Hasselblad)

Pixel size: 10 μm (vertical)×30 μm (horizontal)

Pixel count: 6000 (vertical)×2000 (horizontal)

Horizontal CCD register: 2000 pixels

"Color Pixel" size: 30 μm×30 μm (3 monochrome pixels)

"Color Pixel" resolution: 2000 pixels×2000 pixels

Figure 8:
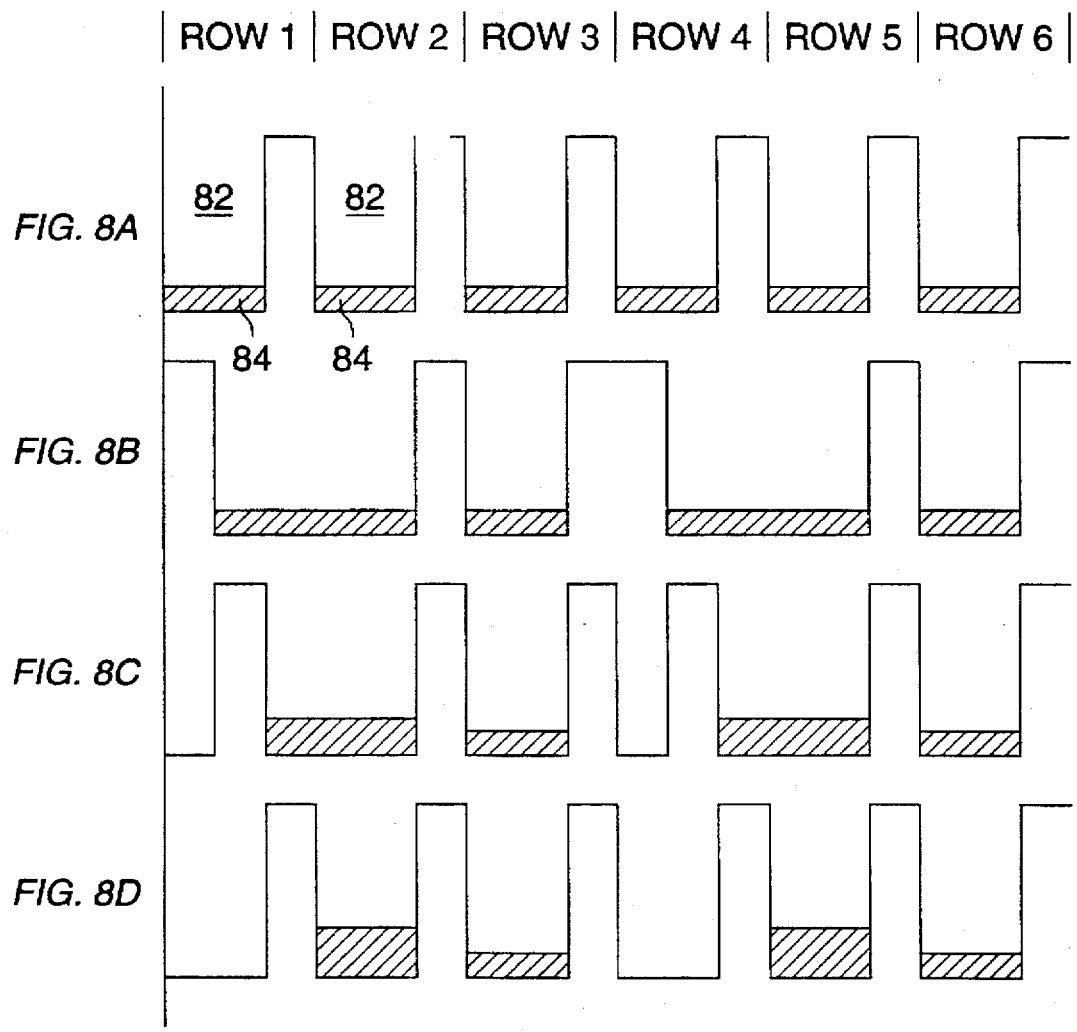
FIGS. 8a–l are stylized illustrations of the potential profile of a portion of a vertical CCD column constructed in accordance with a preferred embodiment of the invention at various times during the imaging process.
Figure 8:
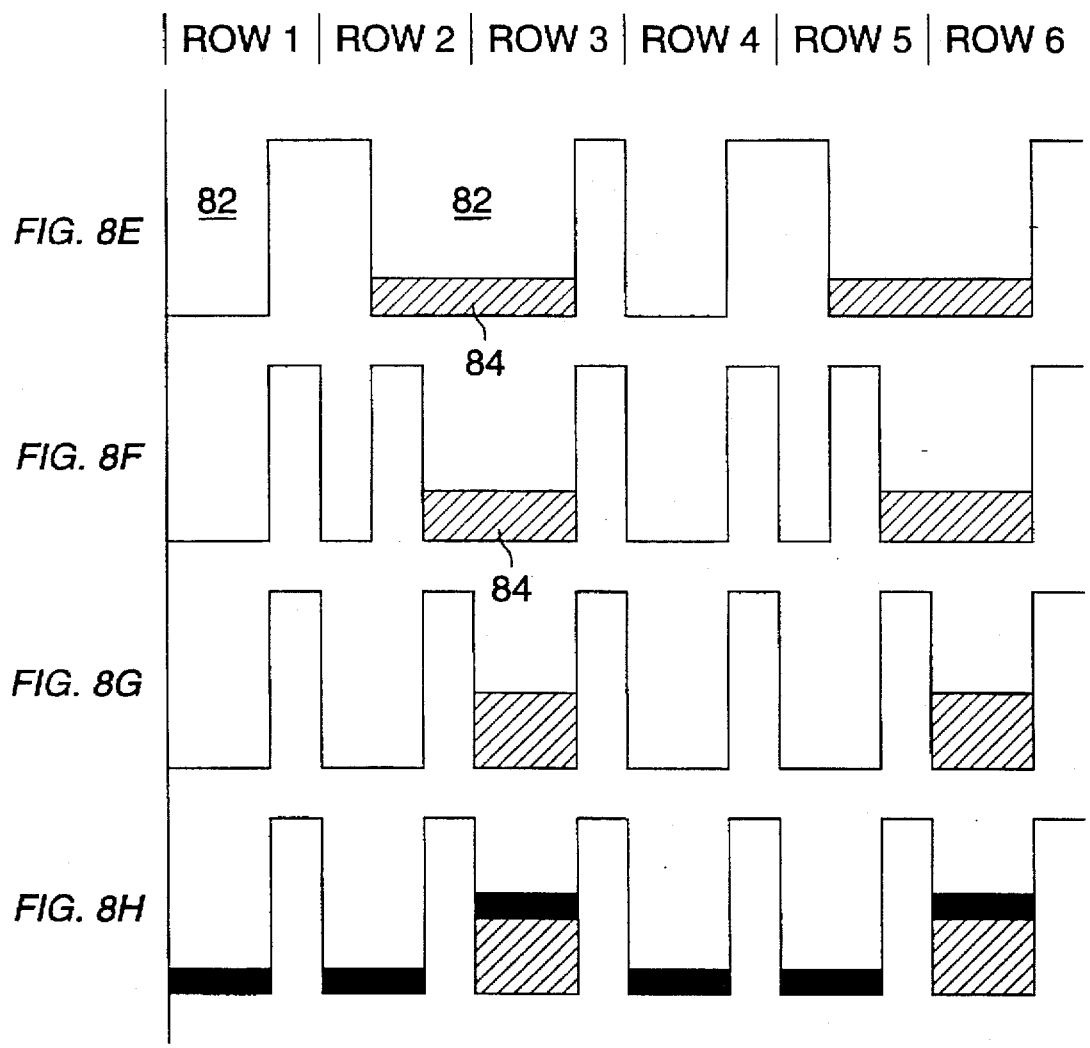
Figure 8:
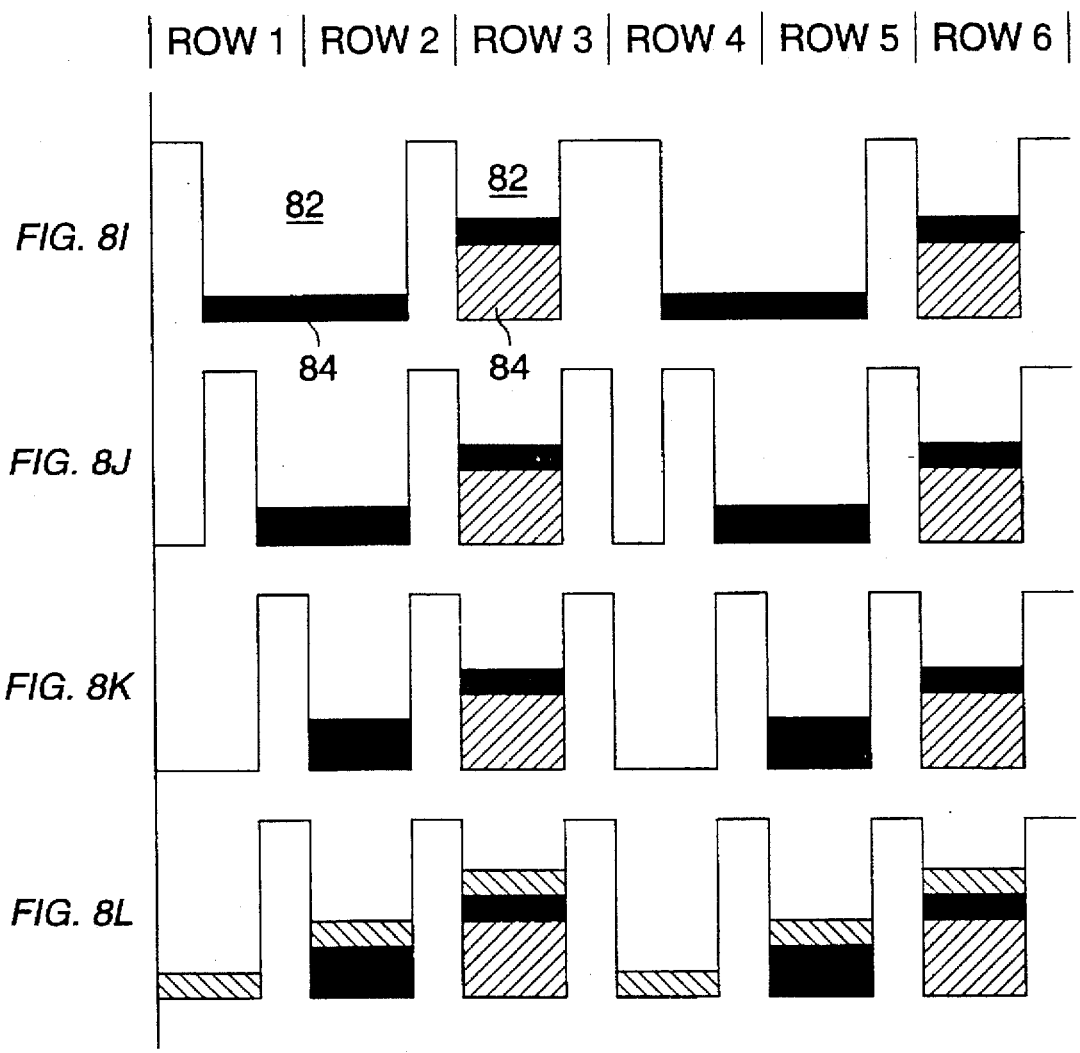

In the preferred embodiment, the entire CCD imager is exposed initially to the blue portion of the image. Blue is the preferred first color exposure because the blue portion of an image has the lowest energy. FIGS. 8a through 8l are idealized representations of potential profiles of a portion of one CCD column at various stages during the acquisition of an image. At time $t_0$, immediately following the blue exposure, the CCD column is in the state shown in FIG. 8a. The "wells" 82 in which charge packets 84 (designated by cross-hatched and shaded areas) are deposited by the exposure are potential wells created by bias voltages on the clock lines $\phi$. The profile shown in FIG. 8a is created by the following state: $\phi_{1A}$, $\phi_{1B}$, $\phi_{1C}$, $\phi_{2A}$, $\phi_{2B}$, and $\phi_{2C}$ are held high, and $\phi_{3A}$, $\phi_{3B}$, and $\phi_{3C}$ are held low. At $t_1$, the voltage on $\phi_{1A}$ is brought low while the voltage on $\phi_{3A}$ is brought high. This alters the potential profile of the CCD column as shown in FIG. 8b. At $t_2$, the voltage on $\phi_{1A}$ is brought high again while the voltage on $\phi_{2A}$ is brought low. This alters the potential profile of the CCD column as shown in FIG. 8c. At $t_3$, the voltage on $\phi_{2A}$ is brought high again while the voltage on $\phi_{3A}$ is brought back low. This alters the potential profile of the CCD column as shown in FIG. 8d. At this point, the charge packets 84 are stored, for example, in rows 2, 3, 5, and 6, leaving rows 1 and 4 empty.

At $t_4$, the voltage on $\phi_{1B}$ is brought low while the voltage on $\phi_{3B}$ is brought high. This alters the potential profile of the CCD column as shown in FIG. 8e. At $t_5$, the voltage on $\phi_{1B}$ is brought back high while the voltage on $\phi_{2B}$ is brought low. This alters the potential profile of the CCD column as shown in FIG. 8f. Finally, at $t_6$, the voltage on $\phi_{2B}$ is brought back high while the voltage on $\phi_{3B}$ is brought low again. This alters the potential profile of the CCD column as shown in FIG. 8g. Thus, for example, the entire blue portion of the image is shifted from rows 1 and 2 into row 3, and from rows 4 and 5 into row 6, leaving rows 1, 2, 4 and 5 empty. This shifting of charge packets 84 occurs in a similar manner across the CCD array.

At $t_7$, immediately after the CCD imager is exposed to the red portion of the image, the state of the clocks lines is again as follows: $\phi_{1A}$, $\phi_{1B}$, $\phi_{1C}$, $\phi_{2A}$, $\phi_{2B}$, and $\phi_{2C}$ are held high, and $\phi_{3A}$, $\phi_{3B}$, and $\phi_{3C}$ are held low. The charge packets 84 are distributed as shown in FIG. 8h, with the cross-hatched regions representing charge from the blue exposure, and the shaded regions representing charge from the red exposure. At $t_8$, the voltage on $\phi_{3A}$ is brought high while the voltage on $\phi_{1A}$ is brought low. This alters the potential profile of the CCD column as shown in FIG. 8i. At $t_9$, the voltage on $\phi_{1A}$ is brought back high while the voltage on $\phi_{2A}$ is brought low. This alters the potential profile of the CCD column as shown in FIG. 8j. At $t_{10}$, the voltage on $\phi_{2A}$ is brought back high while the voltage on $\phi_{3A}$ is again brought low. This alters the potential profile of the CCD column as shown in FIG. 8k. Thus, the red portion of the image is moved, for example, from row 1 into row 2 and from row 4 into row 5. A portion of the red image remains in rows 3 and 6 undisturbed. Rows 1 and 4 are again left empty.

Finally, the entire imager is exposed to the green portion of the image, a portion of which is stored in all of the rows at $t_{11}$ (FIG. 8l).

If one assumes that the light level on three adjacent rows is approximately the same, the technique described above will result in the following approximate charge distribution in the adjacent pixels. Rows 3, 6, and 9 will contain the entire blue portion of the image, ⅓ of the red portion, and ⅓ of the green portion. Rows 2, 5, and 8 will contain ⅔ of the red portion, and ⅓ of the green portion. Rows 1, 4, and 7 will contain only ⅓ of the green portion of the image.

In order for the assumption described above to be valid, the optics of the CCD imager is, in some embodiments, designed to ensure that the imager is incapable of resolving images below a certain critical level. To achieve this result, each pixel is equipped with a plate of birefringent material, such as calcite, which acts to "smear" the incident image, thus acting as a resolution limit.

After exposure to the desired image is complete, the stored charge is downloaded in the following manner. All of the gate electrodes are clocked in a repeating three-phase sequence (the gate electrodes in each horizontal row being clocked simultaneously) and the charge packets stored in each horizontal row are shifted down the array and placed in a horizontal CCD register. Each row is then clocked out sequentially. The output is then digitized and stored in a frame memory for later display or printing.

When deriving an image from the frame memory for displaying or printing, the red, green, and blue color information of a particular "color pixel" is derived. In a preferred embodiment, a color pixel in a derived image corresponds to three vertically adjacent monochrome pixels in the CCD imager. Thus, for example, a color pixel would comprise 3 monochrome pixels from Rows A, B, and C, where Rows A, B, and C are derived according to the following discussion.

The pixels of rows 1, 4, and 7 contain only green information. Therefore, because of the simplifying approximation outlined above, the full value for the green rows can be obtained by multiplying the values stored in rows 1, 4, and 7 by three. This may be represented by the following equations:

Row A=Row 1*3

Row D=Row 4*3

Row G=Row 7*3

Rows A, D, and G corresponding to rows of green pixels in the displayed or printed image.

The pixels of rows 2, 5, and 8 contain both red and green information. Again because of the simplifying assumption, the full value of the red rows can be obtained by subtracting the value stored for rows 1, 4, and 7 from the value stored in rows 2, 5, and 8 and multiplying the result by 3/2. This is represented by the following equations:

Row B=3/2*(Row 2–Row 1)

Row E=3/2*(Row 5–Row 4)

Row H=3/2*(Row 8–Row 7)

Rows B, E, and H corresponding to rows of red pixels in the displayed or printed image.

Finally, the full value of the blue rows can be obtained by adding the value of rows 1, 4, and 7 to the value of rows 2, 5, and 8, dividing the resulting value by 2 and subtracting that number from the value stored in rows 3, 6, and 9. This is represented by the following equations:

Row C=Row 3–½(Row 1+Row 2)

Row F=Row 6–½(Row 4+Row 5)

Row I=Row 9–½(Row 7+Row 8)

Rows C, F, and I corresponding to rows of blue pixels in the displayed or printed image.

An alternate means of processing the stored information to derive the rows of blue pixels is represented by the following equations:

Row C=Row 3–¼(Row 1+Row 2+Row 4+Row 5)

Row F=Row 6–¼(Row 4+Row 5+Row 7+Row 8)

Row I=Row 9–¼(Row 7+Row 8+Row 10+Row 11)

This alternate processing method more accurately derives the blue portion of an image when the simplifying assumption outlined above lacks validity as may sometimes be the case. These equations, in effect, average the values stored in the rows above and below the row to be derived rather than only allowing the rows above the row to be derived to contribute to the final image. In still further embodiments, nearest or near neighbor analysis will further enhance the accuracy of the image.

While the invention has been particularly shown and described with reference to specific embodiments thereof, it will be understood by those skilled in the art that the foregoing and other changes in the form and details may be made therein without departing from the spirit or scope of the invention. Specifically, while the embodiment described above employs a three-phase CCD imager, it will be evident to those skilled in the art that the invention may be implemented using a number of different schemes. For example, if permanent barriers are implanted between adjacent cells, it is possible to achieve the desired shifting functions with fewer than three gate electrodes on each cell. Further, the number of sets of clock signals may vary with the number of colors desired to be stored. Consequently, the scope of the invention should be determined solely with respect to the following claims.

What is claimed is:

1. A method for shifting charge in a charge-coupled device, the charge-coupled device comprising a plurality of photosensitive semiconductor storage cells for storing individual charge packets, each semiconductor storage cell being controlled by at least one gate electrode, the photosensitive semiconductor storage cells configured in an array comprising horizontal rows, the method comprising the step of moving charge packets stored in a first set of horizontal rows of photosensitive semiconductor storage cells into a second set of horizontal rows of photosensitive semiconductor storage cells by manipulating a plurality of sets of clock signals applied to the gate electrodes, each of every three adjacent horizontal rows being controlled by a different set of clock signals, each set of clock signals being distinct and separately controllable.

2. A monochrome charge-coupled device for producing images using sequential exposures, comprising:

a plurality of photosensitive storage regions, each photosensitive storage region comprising first, second, and third photosensitive subregions;

a plurality of clock lines coupled to each photosensitive storage region which are operable to manipulate and combine first and second charge stored in the first and second photosensitive subregions, respectively without disturbing third charge stored in the third photosensitive subregion.

* * * * *